United States Patent
Lim et al.

(10) Patent No.: US 9,385,699 B2
(45) Date of Patent: Jul. 5, 2016

(54) DELAY CELL, DELAY LOCKED LOOK CIRCUIT, AND PHASE LOCKED LOOP CIRCUIT

(71) Applicant: SAMSUNG ELECTRONICS CO., LTD., Suwon-si, Gyeonggi-do (KR)

(72) Inventors: Dong-Hyuk Lim, Seoul (KR); Jae-Jin Park, Seongnam-si (KR); Seung-Hoon Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/719,406

(22) Filed: May 22, 2015

(65) Prior Publication Data

US 2016/0028410 A1   Jan. 28, 2016

(30) Foreign Application Priority Data

Jul. 24, 2014  (KR) .......................... 10-2014-0094155

(51) Int. Cl.
*H03L 7/06* (2006.01)
*H03K 5/135* (2006.01)
*H03L 7/081* (2006.01)
*H03K 5/00* (2006.01)

(52) U.S. Cl.
CPC .............. *H03K 5/135* (2013.01); *H03L 7/0812* (2013.01); *H03K 2005/00013* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 5,349,311 | A | 9/1994 | Mentzer |
| 5,841,170 | A | 11/1998 | Adan et al. |
| 6,794,717 | B2 | 9/2004 | Matsumoto et al. |
| 7,089,527 | B2 | 8/2006 | Hart et al. |
| 7,256,463 | B2 | 8/2007 | Matsumoto et al. |
| 7,432,581 | B2 | 10/2008 | Kanamoto et al. |
| 7,906,990 | B2 | 3/2011 | Morishita |
| 2003/0227059 | A1 | 12/2003 | Miyake et al. |
| 2006/0186474 | A1 | 8/2006 | Matsumoto et al. |
| 2008/0017924 | A1 | 1/2008 | Matsumoto et al. |
| 2008/0035996 | A1 | 2/2008 | Matsumoto et al. |
| 2014/0032949 | A1 | 1/2014 | Kim et al. |

FOREIGN PATENT DOCUMENTS

| | | |
|---|---|---|
| JP | 2000106440 | 4/2000 |
| JP | 3222380 | 8/2001 |
| JP | 2004072063 | 3/2004 |
| JP | 2008172262 | 7/2008 |
| JP | 4574734 | 8/2010 |
| KR | 20140015880 A | 2/2014 |
| WO | WO2005020325 A1 | 3/2005 |

*Primary Examiner* — Adam Houston
(74) *Attorney, Agent, or Firm* — Volentine & Whitt, PLLC

(57) ABSTRACT

A delay cell includes a first transistor and a second transistor, at least one of which has a fully depleted silicon-on-insulator (FD-SOI) structure. A first control voltage is applied to the body of the first transistor and a second control voltage is applied to the body of the second transistors in order to adjust the delay time of the delay cell. DLL and PLL circuits includes this type of delay cell.

20 Claims, 10 Drawing Sheets

DELAY CELL, DELAY LOCKED LOOK CIRCUIT, AND PHASE LOCKED LOOP CIRCUIT

CROSS-REFERENCE TO RELATED APPLICATION

This application claims the benefit of Korean Patent Application No. 10-2014-0094155 filed on Jul. 24, 2014, the subject matter of which is hereby incorporated by reference.

BACKGROUND

The inventive concept relates generally to semiconductor device and related circuits. More particularly, the inventive concept relates to delay cells, delay locked loop (DLL) circuits including delay cells, and phase locked loop (PLL) circuits including delayer cells.

Delay cells are commonly used in integrated circuits to control the timing of a signal. Accordingly, delay cells are often constituent components of DLL and PLL circuits. However, contemporary semiconductor devices require circuits that are tolerant to variations in applied power supply voltages. Thus, delay cell, DLL circuit, and PLL circuit designs capable of operating over a broader range of power supply (or operating) voltages are highly desirable.

SUMMARY

The inventive concept provides delay cells, delay locked loop circuits including the same, and phase locked loop circuits including the same.

According to an aspect of the inventive concept, there is provided a delay cell comprising; a first transistor having a first terminal connected to a power supply voltage terminal, a second terminal connected to an output terminal, and a gate terminal connected to an input terminal, and a second transistor having a first terminal connected to a ground terminal, a second terminal connected to the output terminal, and a gate terminal connected to the input terminal, wherein each of the first and second transistors has a fully depleted silicon-on-insulator (FD-SOI) structure, and at least one of a first control voltage is applied to a body of the first transistor and a second control voltage is applied to a body of the second transistors to adjust a delay time of the delay cell.

According to another aspect of the inventive concept, there is provided a delay locked loop (DLL) circuit comprising; a delay circuit that receives a reference clock signal and includes series connected delay cells that applies a delay to the reference clock signal to generated a delayed buffered version of the reference clock signal, a phase detector that receive the reference clock signal and a feed-back clock signal and generates a first signal corresponding to a phase difference between the feed-back clock signal and the reference clock signal, and a control circuit that generates a first control signal that defines the delay applied to the reference clock signal in response to the first signal, wherein the first control signal is applied to a body of at least one of the transistors constituting at least one of the delay cells, the at least one of the transistors having a fully depleted silicon-on-insulator (FD-SOI) structure.

According to another aspect of the inventive concept, there is provided a phase locked loop (PLL) circuit comprising; a phase detector that receives a reference clock signal and a divided feed-back clock signal and generates a first signal corresponding to a phase difference between the divided feed-back clock signal and the reference clock signal, a control circuit that generates a first control signal that defines a delay applied to the reference clock signal in response to the first signal, a voltage controlled oscillator including delays cells and applying the delay to the reference clock signal to generate the feed-back clock signal, and a divider that receives feed-back signal to generate the divided feed-back signal, wherein the first control signal is applied to a body of at least one of the transistors constituting at least one of the delay cells, the at least one of the transistors having a fully depleted silicon-on-insulator (FD-SOI) structure.

BRIEF DESCRIPTION OF THE DRAWINGS

Certain embodiments of the inventive concept will be described in conjunction with the accompanying drawings in which.

DETAILED DESCRIPTION

Certain embodiments of the inventive concept will now be described in some additional detail with reference to the accompanying drawings, and are provided so that this disclosure will be thorough and complete and fully convey the scope of the inventive concept to those skilled in the art. The embodiments may be embodied in many different forms and only specific embodiments are described in detail with reference to the accompanying drawings. Thus, the inventive concept should not be construed as being limited to only the illustrated embodiments. Throughout the written description and drawings, like reference numbers and labels are used to denote like or similar elements.

The terminology used herein is for the purpose of describing particular embodiments only and is not intended to limit the inventive concept. As used herein, the singular terms "a," "an", and "the" are intended to include the plural forms as well, unless the context clearly indicates otherwise. It will be understood that the terms "comprises", "comprising", "includes", "including", "have", and/or "having" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Expressions such as "at least one of," when preceding a list of elements, modify the entire list of elements and do not modify the individual elements of the list.

In the context of the following embodiments it should be noted that operating speed for a delay cell may be controlled by selectively applying a control voltage to the body of at least one of the transistors constituting the delay cell. In this regard, the delay time of conventional delay cells is usually controlled by adjusting the level of a gate voltage applied to the gate of a transistor constituting the delay cell. However, under operating conditions that assume fluctuation of an applied power supply voltage it is quite difficult to design a delay cell using the conventional approaches that provides a robust operating margin.

Figure 1:
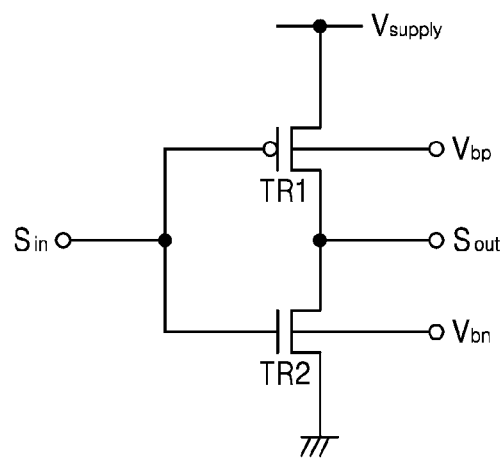
FIGS. 1, 2, 3 and 4 (collectively, "FIGS. 1 to 4") are respective circuit diagrams illustrating various delay cells according to embodiments of the inventive concept.

FIG. 1 is a circuit diagram illustrating a delay cell 10A according to an embodiment of the inventive concept, where the delay cell 10A includes a first transistor TR1 and a second transistor TR2.

The first transistor TR1 has a first terminal electrically connected to a power supply voltage $V_{supply}$ terminal, a second terminal electrically connected to an output terminal $S_{OUT}$, and a gate terminal electrically connected to an input terminal $S_{IN}$. The second transistor TR2 has a first terminal electrically connected to a ground terminal, a second terminal electrically connected to the output terminal $S_{OUT}$, and a gate terminal electrically connected to the input terminal $S_{IN}$.

In certain embodiments of the inventive concept, the first transistor TR1 and second transistor TR2 may have a fully depleted silicon-on-insulator (FD-SOI) structure. Alternatively, the first transistor TR1 and second transistor TR2 may have an ultra-thin body and buried oxide (UTBB) FD-SOI structure.

A control voltage is applied to the body of at least one of the first and second transistors TR1 and TR2 to control a delay time provided by the delay cell 10A. For example, in order to control the delay time of the delay cell 10A, a first control voltage Vbp may be applied to the body of the first transistor TR1 and a second control voltage Vbn may be applied to the body of the second transistor TR2.

In the illustrated example of FIG. 1, the first transistor TR1 is a P-type Metal Oxide Semiconductor (PMOS) transistor and the second transistor TR2 is an N-type MOS (NMOS) transistor, where the first transistor TR1 has a source terminal connected to the power supply voltage $V_{supply}$ terminal, a drain terminal connected to the output terminal $S_{OUT}$, and a gate terminal connected to the input terminal $S_{IN}$ and the second transistor TR2 has a source terminal connected to the ground terminal, a drain terminal connected to the output terminal $S_{OUT}$, and a gate terminal connected to the input terminal $S_{IN}$.

The delay cell 10A illustrated in FIG. 1 functions as an inverter. That is, the delay cell 10A inverts and buffers an input signal applied to the input terminal $S_{IN}$ in order to output an inverted buffered version of the input signal at the output terminal $S_{OUT}$. The respective operation speeds (e.g., switching speeds) of the first and second transistors TR1 and TR2 may be controlled by the first and second control voltages Vbp and Vbn. Thus, the overall operating speed of the delay cell 10A may be controlled by the first and second control voltages Vbp and Vbn.

In this regard, a threshold voltage of an NMOS transistor may be reduced if the body voltage of the NMOS transistor is increased, while a threshold voltage of a PMOS transistor may be reduced if the body voltage of the PMOS transistor is decreased. Accordingly, if the applied first control voltage Vbp decreases the body voltage of the NMOS transistor (the first transistor TR1) and the applied second control voltage Vbn increases the body voltage of the PMOS transistor (the second transistor TR2), the resulting delay time of the delay cell 10A may be reduced. The opposite response is also true. So, if the first control voltage Vbp is increased and/or the second control voltage Vbn is decreased, the delay time of the delay cell 10A will be increased.

Where the delay cell 10A is formed by stacking two transistors on a substrate, the power supply voltage $V_{SUPPLY}$ may be used to commonly drive the delay cell 10A. Conventionally, when the power supply voltage $V_{SUPPLY}$ might fluctuate (i.e., decrease) this would prove very detrimental to the proper operation of the delay cell. However, the delay time of the delay cell 10A in the embodiment illustrated in FIG. 1 is controlled by body biasing voltages, such as the first and second control voltages Vbp and Vbn described above. Accordingly, the delay time of the delay cell 10A may be controlled over a relatively wide range of the control voltages, as compared with a delay cell providing a delay time that is controlled using only a gate biasing voltage.

Figure 2:
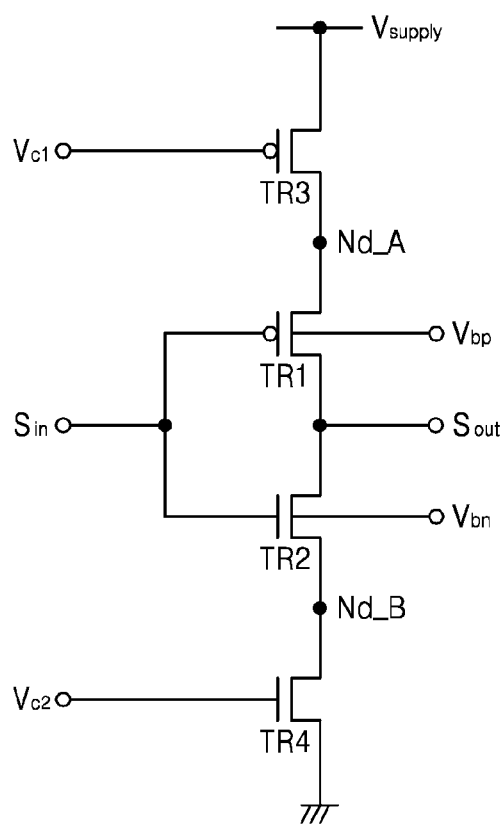

FIG. 2 is a circuit diagram illustrating a delay cell 10B according to another embodiment of the inventive concept, where the delay cell 10B includes first, second, third and fourth transistors TR1, TR2, TR3, and TR4.

The first transistor TR1 has a first terminal electrically connected to a first node Nd_A, a second terminal electrically connected to an output terminal $S_{OUT}$, and a gate terminal electrically connected to an input terminal $S_{IN}$. The second transistor TR2 has a first terminal electrically connected to a second node Nd_B, a second terminal electrically connected to the output terminal $S_{OUT}$, and a gate terminal electrically connected to the input terminal $S_{IN}$. The third transistor TR3 has a first terminal electrically connected to a power supply voltage $V_{supply}$ terminal, a second terminal electrically connected to the first node Nd_A, and a gate terminal to which a third control voltage Vc1 is applied. The fourth transistor TR4 has a first terminal electrically connected to a ground terminal, a second terminal electrically connected to the second node Nd_B, and a gate terminal to which a fourth control voltage Vc2 is applied.

Here, one or more of the first, second, third and fourth transistors TR1, TR2, TR3, and TR4 may have an FD-SOI structure, or a UTBB FD-SOI structure.

Again, respective control voltages may be applied to the body of at least one of the first and second transistors TR1 and TR2 in order to control the delay time of the delay cell 10B. For example, the first control voltage Vbp may be applied to the body of the first transistor TR1 and the second control voltage Vbn may be applied to the body of the second transistor TR2.

In the illustrated example of FIG. 2, the first and third transistors TR1 and TR3 are PMOS transistors while the second and fourth transistors TR2 and TR4 are NMOS transistors, where the first transistor TR1 has a source terminal connected to the first node Nd_A, a drain terminal connected to the output terminal $S_{OUT}$, and a gate terminal connected to the input terminal $S_{IN}$, and the second transistor TR2 has a source terminal connected to the second node Nd_B, a drain terminal connected to the output terminal $S_{OUT}$, and a gate terminal connected to the input terminal $S_{IN}$. The third transistor TR3 has a source terminal connected to the power supply voltage $V_{supply}$ terminal, a drain terminal connected to the first node Nd_A, and a gate terminal to which the third control voltage Vc1 is applied. The fourth transistor TR4 has a source terminal connected to the ground terminal, a drain terminal connected to the second node Nd_B, and a gate terminal to which the fourth control voltage Vc2 is applied.

Like the delay cell 10A illustrated in FIG. 1, the delay cell 10B illustrated in FIG. 2 functions as an inverter. Thus, the delay cell 10B inverts and buffers an input signal applied to the input terminal $S_{IN}$ to output the inverted buffered version of the input signal at the output terminal $S_{OUT}$. A current flowing through the delay cell 10B may be controlled according to the third and fourth control voltages Vc1 and Vc2 applied to the gate terminals of the third and fourth transistors TR3 and TR4, respectively. Thus, a delay time of the delay cell 10B may be controlled according to the third and fourth control voltages Vc1 and Vc2. Moreover, a delay time of the delay cell 10B may further be controlled according to the first and second control voltages Vbp and Vbn applied to the bodies of the first and second transistors TR1 and TR2, respectively.

If the first control voltage Vbp decreases and the second control voltage Vbn increases, the delay time of the delay cell 10B will decrease, or if the first control voltage Vbp increases and the second control voltage Vbn decreases, the delay time of the delay cell 10B will increase.

If the third control voltage Vc1 decreases and the fourth control voltage Vc2 increases, the delay time of the delay cell 10B will decrease, or if the third control voltage Vc1 increases and the fourth control voltage Vc2 decreases, the delay time of the delay cell 10B will increase.

Thus, it will be appreciated that according to various embodiments of the inventive concept, the delay time of the delay cell 10B may be controlled by appropriately setting one or more of the first, second, third, and fourth control voltages Vbp, Vbn, Vc1, and Vc2.

Figure 3:
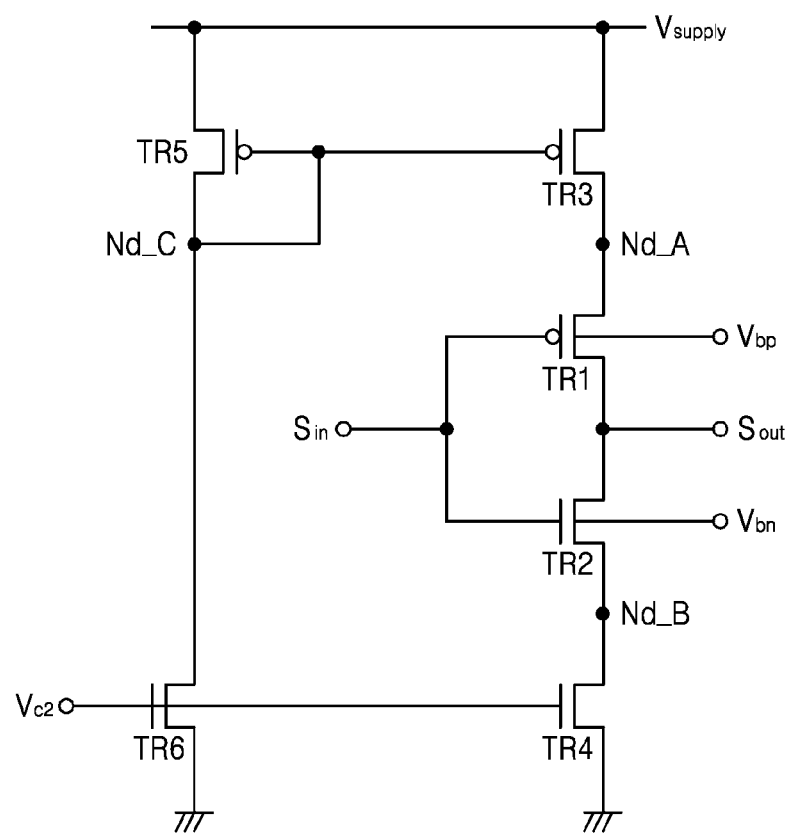

FIG. 3 is a circuit diagram illustrating a delay cell 10C according to still another embodiment of the inventive concept, where the delay cell 10C includes first to sixth transistors TR1, TR2, TR3, TR4, TR5, and TR6.

The first transistor TR1 has first terminal electrically connected to a first node Nd_A, a second terminal electrically connected to an output terminal $S_{OUT}$, and a gate terminal electrically connected to an input terminal $S_{IN}$. The second transistor TR2 has a first terminal electrically connected to a second node Nd_B, a second terminal electrically connected to the output terminal $S_{OUT}$, and a gate terminal electrically connected to the input terminal $S_{IN}$. The third transistor TR3 has a first terminal electrically connected to a power supply voltage $V_{supply}$ terminal, a second terminal electrically connected to the first node Nd_A, and a gate terminal electrically connected to a third node Nd_C. The fourth transistor TR4 has a first terminal electrically connected to a ground terminal, a second terminal electrically connected to the node Nd_B, and a gate terminal to which a fourth control voltage Vc2 is applied. The fifth transistor TR5 has a first terminal electrically connected to the power supply voltage $V_{supply}$ terminal, a second terminal electrically connected to the third node Nd_C, and a gate terminal electrically connected to the third node Nd_C. The sixth transistor TR6 has a first terminal electrically connected to the ground terminal, a second terminal electrically connected to the third node Nd_C, and a gate terminal to which the fourth control voltage Vc2 is applied.

One or more the first, second, third, fourth, fifth and sixth transistors TR1, TR2, TR3, TR4, TR5, and TR6 may have an FD-SOI structure, or a UTBB FD-SOI structure.

Here again, a control voltage may be applied to the body of at least one of the first and second transistors TR1 and TR2 in order to control the delay time of the delay cell 10C. For example, the first control voltage Vbp may be applied to a body of the first transistor TR1 and the second control voltage Vbn may be applied to a body of the second transistor TR2.

In the illustrated embodiment of FIG. 3, the first, third, and fifth transistors TR1, TR3, and TR5 are PMOS transistors and the second, fourth, and sixth transistors TR2, TR4, and TR6 are NMOS transistors, where the first transistor TR1 has a source terminal connected to the first node Nd_A, a drain terminal connected to the output terminal $S_{OUT}$, and a gate terminal connected to the input terminal $S_{IN}$. The second transistor TR2 has a source terminal connected to the second node Nd_B, a drain terminal connected to the output terminal $S_{OUT}$, and a gate terminal connected to the input terminal $S_{IN}$. The third transistor TR3 has a source terminal connected to the power supply voltage $V_{supply}$ terminal, a drain terminal connected to the first node Nd_A, and a gate terminal connected to the third node Nd_C. The fourth transistor TR4 has a source terminal connected to the ground terminal, a drain terminal connected to the second node Nd_B, and a gate terminal to which the fourth control voltage Vc2 is applied. The fifth transistor TR5 has a source terminal connected to the power supply voltage $V_{supply}$ terminal, a drain terminal connected to the third node Nd_C, and a gate terminal connected to the third node Nd_C. The sixth transistor TR6 has a source terminal connected to the ground terminal, a drain terminal connected to the third node Nd_C, and a gate terminal to which the fourth control voltage Vc2 is applied.

Like the delay cell 10A illustrated in FIG. 1 and the delay cell 10B illustrated in FIG. 2, the delay cell 10C illustrated in FIG. 3 functions as an inverter. That is, the delay cell 10C inverts and buffers an input signal applied to the input terminal $S_{IN}$ to output an inverted buffered version of the input signal at the output terminal $S_{OUT}$. A current flowing through the delay cell 10C may be controlled according to the fourth control voltage Vc2 applied to the gate terminals of the fourth and sixth transistors TR4 and TR6. Thus, the delay time of the delay cell 10C may be controlled according to the fourth control voltage Vc2. Moreover, the delay time of the delay cell 10C may further be controlled according to the first and second control voltages Vbp and Vbn applied to the bodies of the first and second transistors TR1 and TR2, respectively.

If the first control voltage Vbp decreases and the second control voltage Vbn increases, the delay time of the delay cell 10C decreases. On the contrary, if the first control voltage Vbp increases and the second control voltage Vbn decreases, the delay time of the delay cell 10C increases.

If the fourth control voltage Vc2 increases, the delay time of the delay cell 10C decreases. On the contrary, if the fourth control voltage Vc2 decreases, the delay time of the delay cell 10C increases.

Thus, it will be appreciated that according to various embodiments of the inventive concept, the delay time of the delay cell 10C may be controlled by appropriately setting the first, second, and fourth control voltages Vbp, Vbn, and Vc2.

Figure 4:
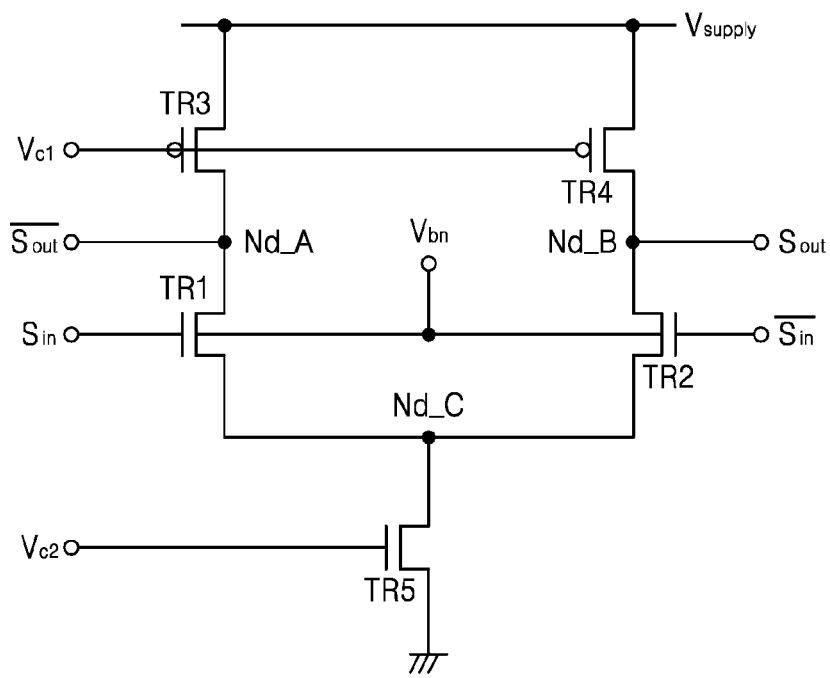

FIG. 4 is a circuit diagram illustrating a delay cell 10D according to yet another embodiment of the inventive concept, where the delay cell 10D has a differential delay circuit configuration and includes first to fifth transistors TR1, TR2, TR3, TR4, and TR5.

In the illustrated example of FIG. 4, the first, second, and fifth transistors TR1, TR2, and TR5 are NMOS transistors while third and fourth transistors TR3 and TR4 are PMOS transistors.

Here, one or more of the first to fifth transistors TR1, TR2, TR3, TR4, and TR5 may have an FD-SOI structure or a UTBB FD-SOI structure.

The first transistor TR1 has a source terminal connected to a first node Nd_A, a drain terminal connected to the first node Nd_A, and a gate terminal connected to an input terminal $S_{IN}$. The second transistor TR2 has a source terminal connected to a third node Nd_C, a drain terminal connected to a second node Nd_B, and a gate terminal connected to a complementary input terminal $/S_{IN}$. The third transistor TR3 has a source terminal connected to a power supply voltage $V_{supply}$ terminal, a drain terminal connected to the first node Nd_A, and a gate terminal to which a third control voltage Vc1 is applied. The fourth transistor TR10 has a source terminal connected to the power supply voltage $V_{SUPPLY}$ terminal, a drain terminal connected to the second node Nd_B, and a gate terminal to which the third control voltage Vc1 is applied. The fifth transistor TR5 has a source terminal connected to a ground terminal, a drain terminal connected to the third node Nd_C, and a gate terminal to which a fourth control voltage Vc2 is applied.

Here, a second control voltage Vbn may be applied to bodies of the first and second transistors TR1 and TR2, respectively, to control the delay time of the delay cell 10D.

The second node Nd_B functions as an output terminal $S_{OUT}$, and the first node Nd_A functions as a complementary output terminal $/S_{OUT}$. The third and fourth transistors TR3 and TR4 act as load transistors and the fifth transistor TR5 acts as a current source.

Accordingly, the delay time of the delay cell 10D may be controlled according to the second, third, and fourth control voltages Vbn, Vc1, and Vc2. If the second control voltage Vbn increases, the delay time of the delay cell 10D decreases. On the contrary, if the second control voltage Vbn decreases, the delay time of the delay cell 10D increases. If the third control voltage Vc1 decreases, the delay time of the delay cell 10D decreases. On the contrary, if the third control voltage Vc1 increases, the delay time of the delay cell 10D increases.

Thus, it will be appreciated that according to various embodiments of the inventive concept, the delay time of the delay cell 10D may be controlled by appropriately setting the second, third, and fourth control voltages Vbn, Vc1, and Vc2.

Figure 5:
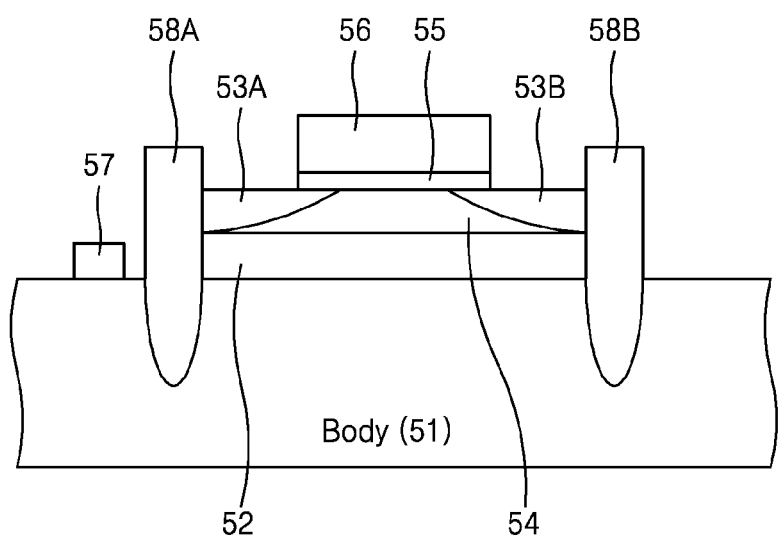
FIGS. 5, 6 and 7 are respective cross-sectional views illustrating body voltage-controlled transistors that may be included in one or more of the delay cells shown in FIGS. 1 to 4.

FIG. 5 is a cross-sectional view illustrating a body voltage-controlled transistor that may be included in any one of the delay cells 10A, 10B, 10C and 10D shown in FIGS. 1 to 4.

The body voltage-controlled transistor illustrated in FIG. 5 has an FD-SOI structure, including a body layer 51, a buried oxide layer 52 formed on the body layer 51, impurity regions 53A and 53B (acting as source and drain regions) formed on the buried oxide layer 52, a silicon layer 54 disposed between the impurity regions 53A and 53B to contact the buried oxide layer 52, a gate insulation layer 55 formed on a top surface of the silicon layer 54 opposite to the buried oxide layer 52, a gate electrode 56 formed on the gate insulation layer 55, and a body electrode 57 formed on the body layer 51.

In FIG. 5, elements indicated by reference designators 58A and 58B are insulation layers that isolate the FD-SOI transistor from other devices formed on the body layer 51. That is, the insulation layers 58A and 58B may act as isolation layers.

A voltage applied to the body layer 51 under the buried oxide layer 52 will influence an energy band bending in the silicon layer 54, and the energy band bending in the silicon layer 54 may influence a threshold voltage of the FD-SOI transistor. Thus, a threshold voltage of the FD-SOI transistor may vary according to the voltage applied to the body electrode 57. In particular, if the body voltage-controlled transistor illustrated in FIG. 5 has a UTBB FD-SOI structure, a threshold voltage of the UTBB FD-SOI transistor may be more readily controlled according to the voltage applied to the body electrode 57 because the buried oxide layer 52 is very thin.

Because the body layer 51 is electrically insulated from the impurity regions 53A and 53B acting as source and drain regions, a range of a voltage applied to the body electrode 57 may be broadened.

If the FD-SOI transistor is an NMOS transistor, a threshold voltage of the FD-SOI transistor will be decreased if a body voltage applied to the body electrode 57 increases, and if the FD-SOI transistor is a PMOS transistor, a threshold voltage of the FD-SOI transistor will be decreased if a body voltage applied to the body electrode 57 decreases.

Figure 6:
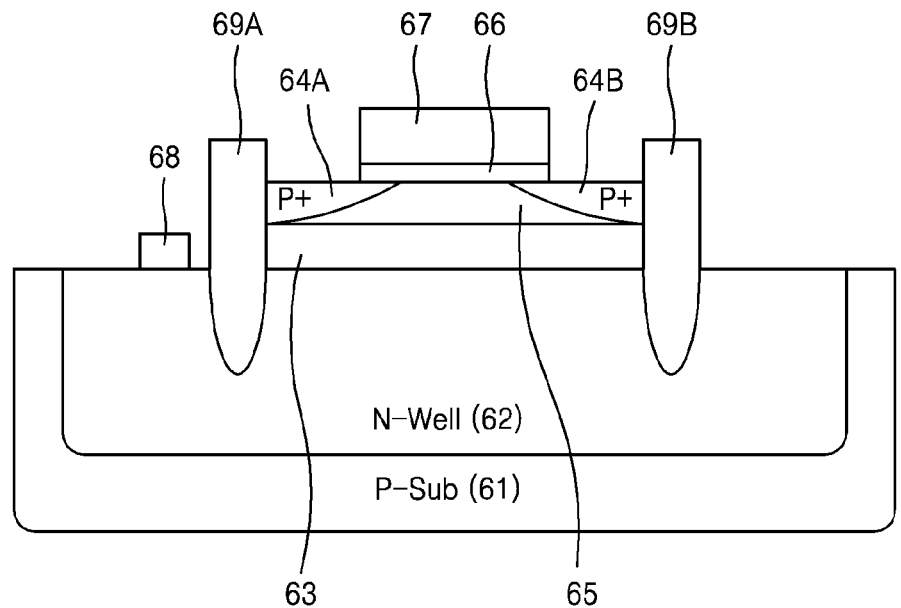

FIG. 6 is a cross-sectional view illustrating a body voltage-controlled PMOS transistor that may be included in any one of the delay cells 10A, 10B, 10c and 10D shown in FIGS. 1 to 4.

The body voltage-controlled PMOS transistor illustrated in FIG. 6 is an FD-SOI structure including a P-type substrate 61, an N-type well region 62 formed in the P-type substrate 61, a buried oxide layer 63 formed on the N-type well region 62, P-type impurity regions 64A and 64B (acting as source and drain regions) formed on the buried oxide layer 63, a silicon layer 65 disposed between the P-type impurity regions 64A and 64B to contact the buried oxide layer 63, a gate insulation layer 66 formed on a top surface of the silicon layer 65 opposite to the buried oxide layer 63, a gate electrode 67 formed on the gate insulation layer 66, and a body electrode 68 formed on the N-type well region 62. The N-type well region 62 may correspond to the body layer 51 illustrated in FIG. 5.

In FIG. 6, elements indicated by reference designators 69A and 69B are insulation layers that isolate the FD-SOI PMOS transistor from other devices formed on the P-type substrate 61. That is, the insulation layers 69A and 69B may act as isolation layers.

Figure 7:
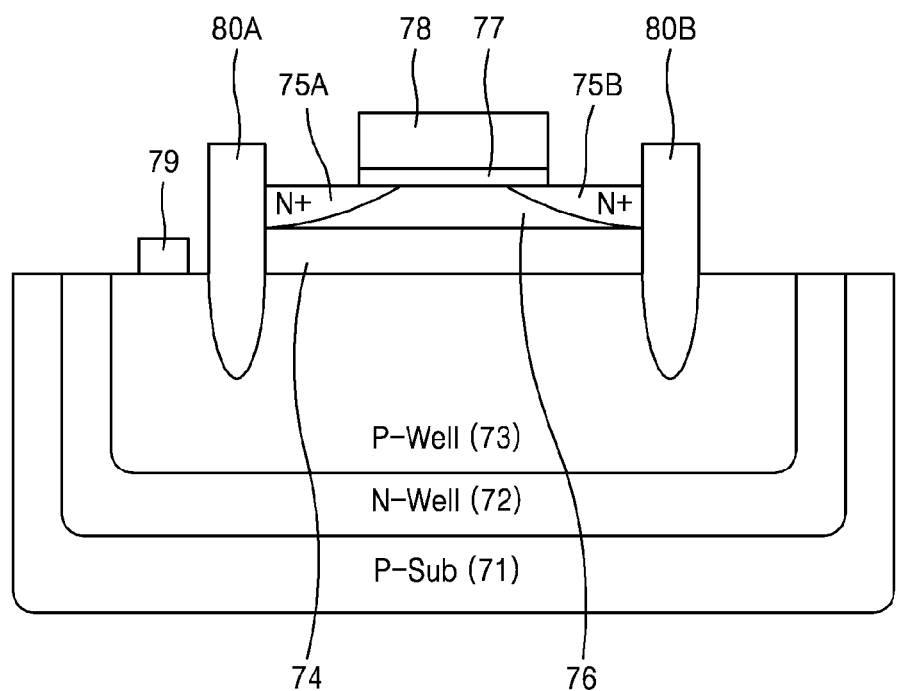

FIG. 7 is a cross-sectional view illustrating a body voltage-controlled NMOS transistor that may be included in any one of the delay cells 10A, 10B, 10c and 10D shown in FIGS. 1 to 4.

The body voltage-controlled NMOS transistor illustrated in FIG. 7 is an FD-SOI structure including a P-type substrate 71, an N-type well region 72 formed in the P-type substrate 71, a P-type well region 73 formed in the N-type well region 72, a buried oxide layer 74 formed on the P-type well region 73, N-type impurity regions 75A and 75B (acting as source and drain regions) formed on the buried oxide layer 74, a silicon layer 76 disposed between the N-type impurity regions 75A and 75B to contact the buried oxide layer 74, a gate insulation layer 77 formed on a top surface of the silicon layer 76 opposite to the buried oxide layer 74, a gate electrode 78 formed on the gate insulation layer 77, and a body electrode 79 formed on the P-type well region 73. The P-type well region 73 may correspond to the body layer 51 illustrated in FIG. 5.

In FIG. 7, elements indicated by reference designators 80A and 80B are insulation layers that isolate the FD-SOI NMOS transistor from other devices formed on the P-type substrate 71. That is, the insulation layers 80A and 80B may act as isolation layers.

Figure 8:
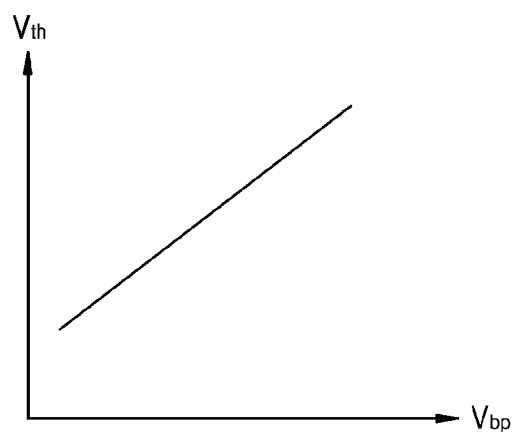
FIG. 8 is a graph illustrating a relationship between a body control voltage and a threshold voltage of the PMOS transistor having the fully depleted silicon-on-insulator (FD-SOI) structure shown in FIG. 6.

FIG. 8 is a graph illustrating a relationship between a body control voltage and a threshold voltage for the FD-SOI PMOS transistor shown in FIG. 6. In FIG. 8, the abscissa represents a body control voltage Vbp applied to the body electrode 68 of the FD-SOI PMOS transistor shown in FIG. 6, and the ordinate represents a threshold voltage Vth of the FD-SOI PMOS transistor shown in FIG. 6.

Referring to FIG. 8, it can be understood that the threshold voltage Vth of the FD-SOI PMOS transistor is proportional to the body control voltage Vbp applied to the body electrode of the FD-SOI PMOS transistor. That is, the threshold voltage Vth of the FD-SOI PMOS transistor may increase if the body control voltage Vbp increases, and the threshold voltage Vth of the FD-SOI PMOS transistor may be lowered if the body control voltage Vbp decreases.

Figure 9:
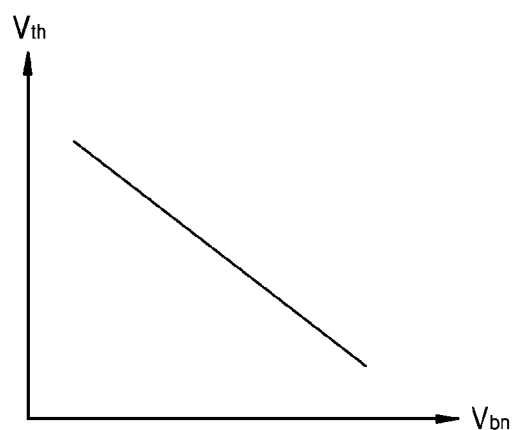
FIG. 9 is a graph illustrating a relationship between a body control voltage and a threshold voltage of the NMOS transistor having the fully depleted silicon-on-insulator (FD-SOI) structure shown in FIG. 7.

FIG. 9 is a graph illustrating a relationship between a body control voltage and a threshold voltage of the FD-SOI NMOS transistor shown in FIG. 7. In FIG. 9, the abscissa represents a body control voltage Vbn applied to the body electrode 79 of the FD-SOI NMOS transistor shown in FIG. 7, and the ordinate represents a threshold voltage Vth of the FD-SOI NMOS transistor shown in FIG. 7.

Referring to FIG. 9, it can be understood that the threshold voltage Vth of the FD-SOI NMOS transistor is inversely proportional to the body control voltage Vbn applied to the body electrode of the FD-SOI NMOS transistor. That is, the threshold voltage Vth of the FD-SOI NMOS transistor may be lowered if the body control voltage Vbn increases, and the threshold voltage Vth of the FD-SOI NMOS transistor may increase if the body control voltage Vbn decreases.

The delay cells 10A, 10B, 10C and 10D illustrated in FIGS. 1 to 4 may be applied to various electronic devices. For example, various the delay cells according to the embodiments of the inventive concept may be employed in delay locked loop (DLL) circuits and/or phase locked loop (PLL) circuits.

Figure 10:
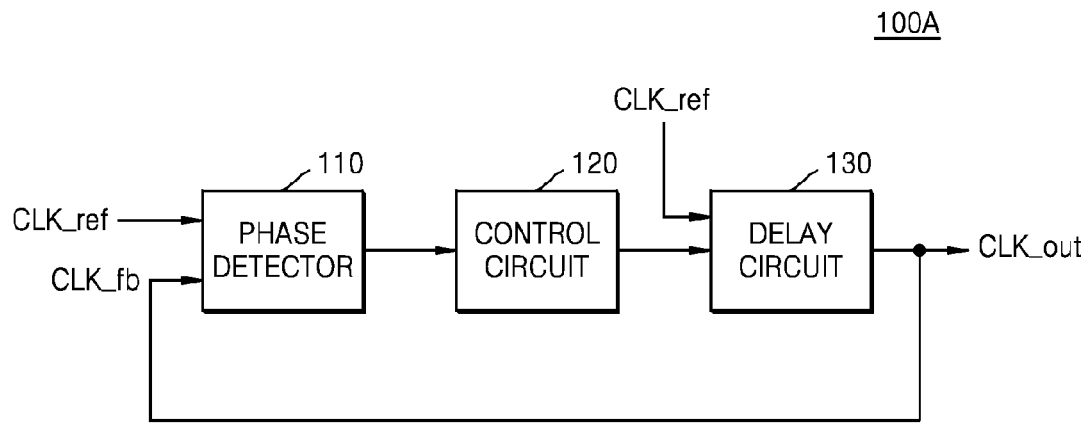
FIGS. 10 and 11 are respective block diagram illustrating in various examples delay locked loop circuits including delay cells according to certain embodiments of the inventive concept.

FIG. 10 is a block diagram illustrating a DLL circuit 100A including delay cells according to embodiments of the inventive concept.

Referring to FIG. 10, the DLL circuit 100A includes a phase detector 110, a control circuit 120, and a delay circuit 130. At least one of the delay cells 10A, 10B, 10C, and 10D illustrated in FIGS. 1 to 4 may be employed in the delay circuit 130.

The phase detector 110 may be used to generate a first signal corresponding to a difference in phase between a feedback clock signal CLK_fb induced from an output signal of the delay circuit 130 and a reference clock signal CLK_ref supplied from an external device. The first signal may be a phase control signal including an up-signal and/or a down-signal.

For example, the phase detector 110 may be used to generate an up-signal and down-signal as follows. The down-signal may be set to have a logic "1" level if a first rising edge of the reference clock signal CLK_ref is applied to the phase detector 110, and the up-signal may be set to have a logic "1" level if a first rising edge of the feed-back clock signal CLK_fb is applied to the phase detector 110. Both the down-signal and the up-signal may be set to have a logic "0" level if a rising edge of the reference clock signal CLK_ref and a rising edge of the feed-back clock signal CLK_fb are continuously applied to the phase detector 110. If a rising edge of the reference clock signal CLK_ref precedes a rising edge of the feed-back clock signal CLK_fb, the down-signal may have a logic "1" level to increase a delay time of the delay circuit 130 until a next rising edge of the feed-back clock signal CLK_fb is applied to the phase detector 110. On the contrary, if a rising edge of the feed-back clock signal CLK_fb precedes a rising edge of the reference clock signal CLK_ref, the up-signal may have a logic "1" level to reduce a delay time of the delay circuit 130 until a next rising edge of the reference clock signal CLK_ref is applied to the phase detector 110.

The control circuit 120 receives the first signal provided by the phase detector 110 and generates a first control signal for controlling a delay time of the delay circuit 130. For example, the control circuit 120 may increase a voltage level of the first control signal in response to the up-signal or decrease the voltage level of the first control signal in response to the down-signal.

The control circuit 120 receives the first signal provided by the phase detector 110 to generate a coarse control signal for roughly tuning a delay time of the delay circuit 130 and a fine control signal for more accurately tuning a delay time of the delay circuit 130. For example, the coarse control signal may be generated when the DLL circuit 100A is initialized or the logic level of the reference clock signal CLK_ref is changed, and the fine control signal may be generated when the DLL circuit 100A is operating in a stable state.

The control circuit 120 may also generate a second control signal that compensates variations in process, voltage, and/or temperature.

In the context of the preceding description, the control circuit 120 may be used to generate the first control voltage Vbp and second control voltage Vbn in response to the first control signal. For example, the control circuit 120 may generate the second control voltage Vbn proportional with a voltage level of the first control signal, and the first control voltage Vbp inversely proportional with the voltage level of the first control signal.

The control circuit 120 may be used to generate any one or more of the first control voltage Vbp, second control voltage Vbn, third control voltage Vc1, and fourth control voltage Vc2 from the first control signal or the second control signal. Or the control circuit 120 may be used to generate any one or more of the first control voltage Vbp, second control voltage Vbn, third control voltage Vc1, and fourth control voltage Vc2 from the coarse control signal or the fine control signal.

The delay circuit 130 may be sued to delay the reference clock signal CLK_ref based on one or more of the first control voltage Vbp, second control voltage Vbn, third control voltage Vc1, and fourth control voltage Vc2. Thus, the delay circuit 130 functions as a voltage-controlled delay circuit and may be realized using any one or more of the delay cells 10A, 10B, 10C, and 10D illustrated in FIGS. 1 to 4.

Figure 11:
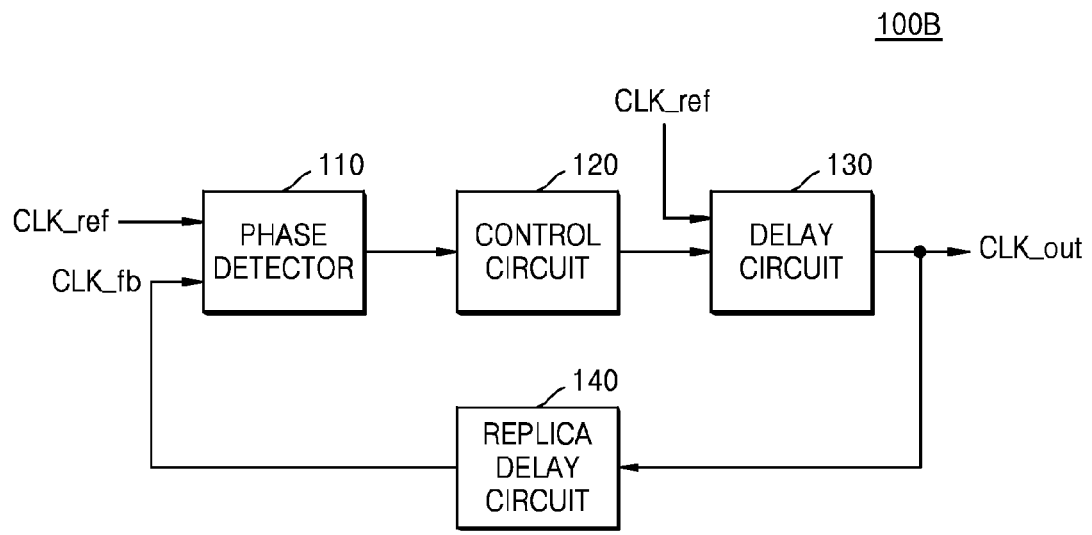

FIG. 11 is a block diagram illustrating a DLL circuit 100B including delay cells according to embodiments of the inventive concept.

Referring to FIG. 11, the DLL circuit 100B includes a phase detector 110, a control circuit 120, a delay circuit 130, and a replica delay circuit 140.

In relation to the embodiment described with respect to FIG. 10, the DLL circuit 100B of FIG. 11 further includes the replica delay circuit 140. The phase detector 110, the control circuit 120, and the delay circuit 130 may have the same configurations as described with reference to FIG. 10.

The replica delay circuit 140 may be used to compensate for an essential delay time of a system, for example, a delay time of a clock buffer circuit (not shown) and a delay time due to interconnection lines in the system. The replica delay circuit 140 may be realized using a delay model circuit. That is, the replica delay circuit 140 may additionally retard an output clock signal CLK_out provided from the delay circuit 130 by using a delay model circuit and may output the delayed output clock signal as the feed-back clock signal CLK_fb.

Accordingly, the phase detector 110 may generate the first signal corresponding to a difference in phase between the feed-back clock signal CLK_fb provided from the replica delay circuit 140 and the reference clock signal CLK_ref received from an external device.

Figure 12:
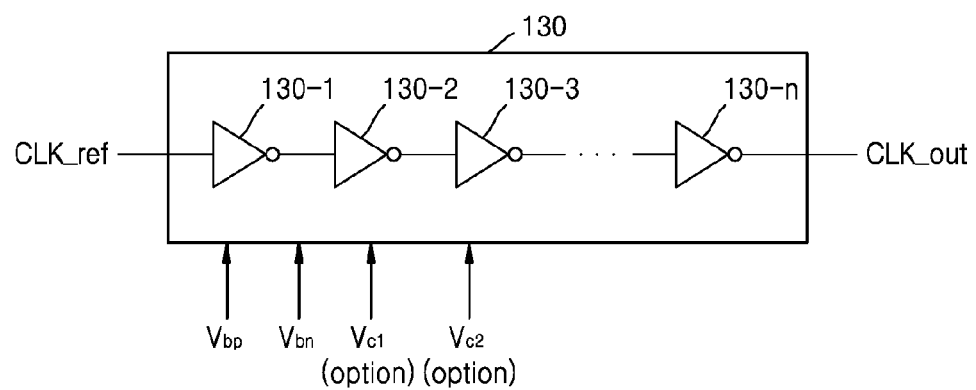
FIG. 12 is a logic circuit diagram further illustrating in one example the delay circuit 130 that may be included in the delay locked loop circuits of FIGS. 10 and 11.

FIG. 12 is a logic circuit diagram further illustrating in one example a delay circuit 130 that may be included the DLL circuits 100A and 100B of FIGS. 10 and 11.

Referring to FIG. 12, the delay circuit 130 is configured to include 'N' series-connected delay cells 130-1, 130-2, 130-3, . . . and 130-N, where N is a natural number greater than one. A reference clock signal CLK_ref is applied to an input terminal of the first delay cell 130-1, and the output clock signal CLK_out is provided at an output terminal of the N$^{th}$ delay cell 130-N. An input terminal of the second delay cell 130-2 is electrically connected to an output terminal of the first delay cell 130-1 corresponding to a previous stage of the second delay cell 130-2, and an input terminal of the third delay cell 130-3 is electrically connected to an output terminal of the second delay cell 130-2 corresponding to a previous stage of the third delay cell 130-3. The remaining delay cells may be connected in similar manner.

One or more of the delay cells 130-1, 130-2, 130-3, . . . and 130-N may be realized using the delay cell 10A of FIG. 1. In such a case, the first control voltage Vbp may be applied to the bodies of the first transistors TR1 of the delay cells 10A, and the second control voltage Vbn may be applied to the bodies of the second transistors TR2 of the delay cells 10A. The first control voltage Vbp and the second control voltage Vbn may be generated from the control circuit 120 of the DLL circuit 100A or 100B illustrated in FIG. 10 or 11 and may be supplied to the delay circuit 130.

One or more of the delay cells 130-1, 130-2, 130-3, . . . and 130-N may alternately be realized using the delay cell 10B of FIG. 2. In such a case, the first control voltage Vbp may be applied to the bodies of the first transistors TR1 of the delay cells 10B, and the second control voltage Vbn may be applied to the bodies of the second transistors TR2 of the delay cells 10B. In addition, the third control voltage Vc1 may be applied to the gate terminals of the third transistors TR3 of the delay cells 10B, and the fourth control voltage Vc2 may be applied to the gate terminals of the fourth transistors TR4 of the delay cells 10B. The first, second, third, and fourth control voltages Vbp, Vbn, Vc1, and Vc2 may be generated from the control circuit 120 of the DLL circuit 100A or 100B illustrated in FIG. 10 or 11 and may be supplied to the delay circuit 130.

One or more of the delay cells 130-1, 130-2, 130-3, . . . and 130-N may alternately be realized using the delay cell 10C of FIG. 3. In such a case, the first control voltage Vbp may be applied to the bodies of the first transistors TR1 of the delay cells 10C, and the second control voltage Vbn may be applied to the bodies of the second transistors TR2 of the delay cells 10C. In addition, the fourth control voltage Vc2 may be applied to the gate terminals of the fourth and sixth transistors TR4 and TR6 of the delay cells 10C. The first, second, and fourth control voltages Vbp, Vbn, and Vc2 may be generated from the control circuit 120 of the DLL circuit 100A or 100B illustrated in FIG. 10 or 11 and may be supplied to the delay circuit 130.

One or more of the delay cells 130-1, 130-2, 130-3, . . . and 130-N may alternately be realized using the delay cell 10D of FIG. 4. In such a case, the second control voltage Vbn may be applied to the bodies of the first and second transistors TR1 and TR2 of the delay cells 10D. In addition, the third control voltage Vc1 may be applied to the gate terminals of the third and fourth transistors TR3 and TR4 of the delay cells 10D, and the fourth control voltage Vc2 may be applied to the gate terminals of the fifth transistor TR5 of the delay cells 10D. The second, third, and fourth control voltages Vbn, Vc1, and Vc2 may be generated by the control circuit 120 of the DLL circuit 100A or 100B illustrated in FIG. 10 or 11 and may be supplied to the delay circuit 130. In some embodiments, at least one of the third and fourth control voltage Vc1 and Vc2 may be set to be a fixed voltage.

Figure 13:
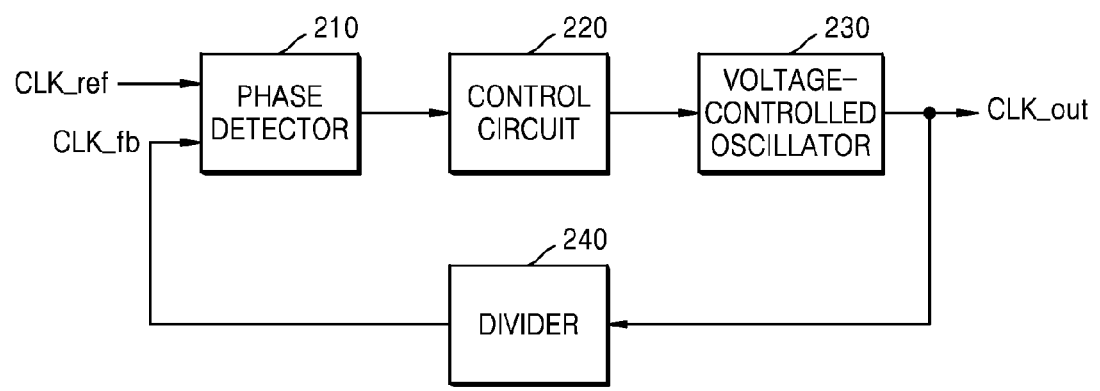
FIG. 13 is a block diagram illustrating in one example a phase locked loop circuit including delay cells according to certain embodiments of the inventive concept.

FIG. 13 is a block diagram illustrating a PLL circuit 200 including delay cells according to embodiments of the inventive concept.

Referring to FIG. 13, the PLL circuit 200 includes a phase detector 210, a control circuit 220, a voltage-controlled oscillator 230, and a divider 240. The delay cells 10A, 10B, 10C, and 10D illustrated in FIGS. 1 to 4 may be employed in the voltage-controlled oscillator 230.

The phase detector 210 may generate a first signal corresponding to a difference in phase between a feed-back clock signal CLK_fb obtained from an output signal of the voltage-controlled oscillator 230 and a reference clock signal CLK_ref supplied from an external device. The first signal may be a phase control signal including an up signal and a down signal. The phase detector 210 may have the same configuration as the phase detector 110 described with reference to FIG. 10. That is, the phase control signal provided from the phase detector 210 may be generated in the same manner as described with reference to the phase detector 110 illustrated in FIG. 10.

The control circuit 220 may receive the first signal provided from the phase detector 210 to generate a first control signal for controlling a delay time of the voltage-controlled oscillator 230. For example, the control circuit 220 may increase a voltage level of the first control signal in response to the up signal and may decrease a voltage level of the first control signal in response to the down signal.

The control circuit 220 may receive the first signal provided from the phase detector 210 to generate a coarse control signal for roughly tuning a delay time of the voltage-controlled oscillator 230 and a fine control signal for accurately tuning a delay time of the voltage-controlled oscillator 230.

The control circuit 220 may further include a circuit that generates a second control signal for compensating for variation of at least one selected from the group consisting of a process, a voltage, and a temperature.

In one embodiment, the control circuit 220 may generate a first control voltage Vbp and a second control voltage Vbn from the first control signal. For example, the control circuit 220 may generate the second control voltage Vbn which is proportional to a voltage level of the first control signal and the first control voltage Vbp which is inversely proportional to a voltage level of the first control signal.

In another embodiment, the control circuit 220 may generate the first control voltage Vbp and the second control voltage Vbn from the second control signal. For example, the control circuit 220 may generate the second control voltage Vbn which is proportional to a voltage level of the second control signal and the first control voltage Vbp which is inversely proportional to a voltage level of the second control signal.

In still another embodiment, the control circuit 220 may generate a third control voltage Vc1 and a fourth control voltage Vc2 from the first or second control signal. For example, the control circuit 220 may generate the fourth control voltage Vc2 which is proportional to a voltage level of the first or second control signal. Alternatively, the control circuit 220 may generate the fourth control voltage Vc2 which is proportional to a voltage level of the first or second control signal and the third control voltage Vc1 which is inversely proportional to a voltage level of the first or second control signal.

In yet another embodiment, the control circuit 220 may generate the first control voltage Vbp and the second control voltage Vbn from the coarse control signal or the fine control signal. For example, the control circuit 220 may generate the second control voltage Vbn which is proportional to a voltage level of the coarse control signal or the fine control signal and the first control voltage Vbp which is inversely proportional to a voltage level of the coarse control signal or the fine control signal.

In yet still another embodiment, the control circuit 220 may generate the third control voltage Vc1 and the fourth control voltage Vc2 from the coarse control signal or the fine control signal. For example, the control circuit 220 may generate the fourth control voltage Vc2 which is proportional to a voltage level of the coarse control signal or the fine control signal. Alternatively, the control circuit 220 may generate the fourth control voltage Vc2 which is proportional to a voltage level of the coarse control signal or the fine control signal and the third control voltage Vc1 which is inversely proportional to a voltage level of the coarse control signal or the fine control signal.

The voltage-controlled oscillator 230 may be used to adjust the frequency of an oscillation signal (i.e., an output signal of the voltage-controlled oscillator 230) based on at least one selected from the group consisting of the first control voltage Vbp, the second control voltage Vbn, the third control voltage Vc1, and the fourth control voltage Vc2.

The voltage-controlled oscillator 230 of FIG. 13 is assumed to be a ring oscillator, and may be realized using one or more of the delay cells 10A, 10B, 10C, and 10D illustrated in FIGS. 1 to 4. The voltage-controlled oscillator 230 may be used to control body voltages of the transistors constituting the delay cells in response to the first or second control voltage Vbp or Vbn to adjust a frequency of the oscillation signal provided therefrom. The oscillation signal provided from the voltage-controlled oscillator 230 may correspond to an output clock signal CLK_out.

The divider 240 receives the output clock signal CLK_out provided by the voltage-controlled oscillator 230 and divides the frequency of the output clock signal CLK_out. The divider 240 then outputs the frequency-divided output clock signal CLK_out as a feed-back clock signal CLK_fb to the phase detector 210. For example, if the output clock signal CLK_out has a frequency of 1 GHz, the divider 240 may divide the frequency of the output clock signal CLK_out to generate the feed-back clock signal CLK_fb having a frequency of 100 MHz.

Figure 14:
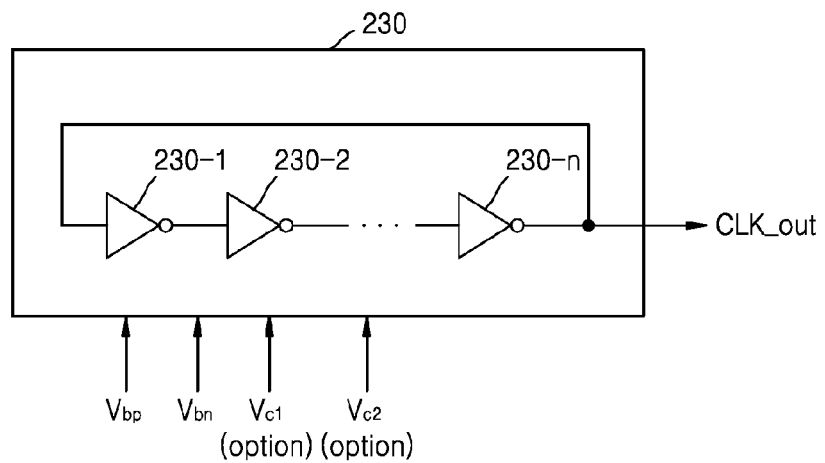
FIG. 14 is a logic circuit diagram further illustrating in one example the voltage-controlled oscillator that may be included in the phase locked loop circuit of FIG. 13.

FIG. 14 is a logic circuit diagram further illustrating one example of the voltage-controlled oscillator 230 that may be included in the PLL circuit 200 of FIG. 13.

Referring to FIG. 14, the voltage-controlled oscillator 230 is configured to include 'N' series-connected delay cells 230-1, 230-2, ... and 230-N. An input terminal of the first delay cell 230-1 is electrically connected to an output terminal of the $N^{th}$ delay cell 230-N corresponding to a previous stage of the first delay cell 230-1, and an output terminal of the first delay cell 230-1 is electrically connected to an input terminal of the second delay cell 230-2 corresponding to a next stage of the first delay cell 230-1. The remaining delay cells may be connected in series in a similar manner.

In one embodiment, each of the delay cells 230-1, 230-2, ... and 230-N may be realized using the delay cell 10A of FIG. 1. In such a case, the first control voltage Vbp is applied to the bodies of the first transistors TR1 of the delay cells 10A, and the second control voltage Vbn is applied to the bodies of the second transistors TR2 of the delay cells 10A. The first control voltage Vbp and the second control voltage Vbn may be generated from the control circuit 220 of the PLL circuit 200 illustrated in FIG. 13 and may be supplied to the voltage-controlled oscillator 230.

In another embodiment, each of the delay cells 230-1, 230-2, ... and 230-N may be realized using the delay cell 10B of FIG. 2. In such a case, the first control voltage Vbp is applied to the bodies of the first transistors TR1 of the delay cells 10B, and the second control voltage Vbn is applied to the bodies of the second transistors TR2 of the delay cells 10B. In addition, the third control voltage Vc1 is applied to the gate terminals of the third transistors TR3 of the delay cells 10B, and the fourth control voltage Vc2 is applied to the gate terminals of the fourth transistors TR4 of the delay cells 10B. The first, second, third, and fourth control voltages Vbp, Vbn, Vc1, and Vc2 may be generated by the control circuit 220 of the PLL circuit 200 illustrated in FIG. 13 and supplied to the voltage-controlled oscillator 230.

In still another embodiment, each of the delay cells 230-1, 230-2, ... and 230-N may be realized using the delay cell 10C of FIG. 3. In such a case, the first control voltage Vbp is applied to the bodies of the first transistors TR1 of the delay cells 10C, and the second control voltage Vbn is applied to the bodies of the second transistors TR2 of the delay cells 10C. In addition, the fourth control voltage Vc2 is applied to the gate terminals of the fourth and sixth transistors TR4 and TR6 of the delay cells 10C. The first, second, and fourth control voltages Vbp, Vbn, and Vc2 may be generated by the control circuit 220 of the PLL circuit 200 illustrated in FIG. 13 and supplied to the voltage-controlled oscillator 230.

In yet another embodiment, each of the delay cells 230-1, 230-2, ... and 230-N may be realized using the delay cell 10D of FIG. 4. In such a case, the second control voltage Vbn is applied to the bodies of the first and second transistors TR1 and TR1 of the delay cells 10D. In addition, the third control voltage Vc1 is applied to the gate terminals of the third and fourth transistors TR3 and TR4, and the fourth control voltage Vc2 is applied to the gate terminals of the fifth transistor TR5. The second, third, and fourth control voltages Vbn, Vc1, and Vc2 may be generated by the control circuit 220 of the PLL circuit 200 illustrated in FIG. 13 and supplied to the voltage-controlled oscillator 230. In some embodiments, at least one of the third and fourth control voltage Vc1 and Vc2 may be a fixed voltage.

Figure 15:
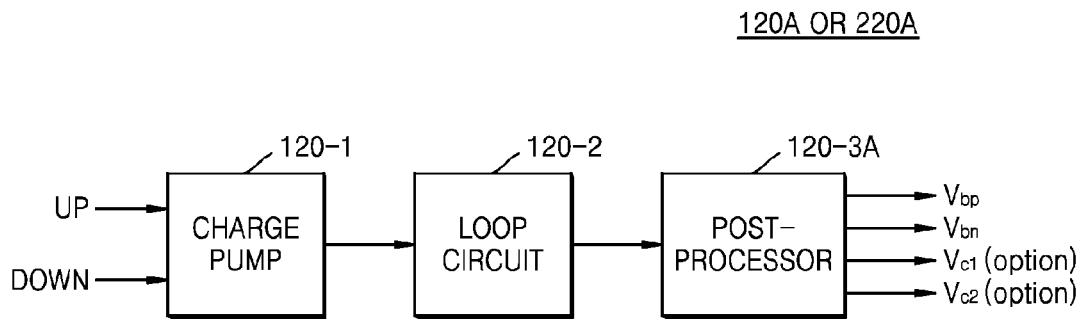
FIG. 15 are respective block diagrams illustrating in different examples a control circuit that may be included in the delay locked loop circuits of FIGS. 10 and 11 or the phase locked loop circuit of FIG. 13.

FIG. 15 is a block diagram illustrating a control circuit 120A as an example of the control circuits 120 illustrated in FIGS. 10 and 11, or a control circuit 220A as an example of the control circuit 220 illustrated in FIG. 13.

Referring to FIG. 15, the control circuit 120A/220A include a charge pump 120-1, a loop filter 120-2 and a post-processor 120-3A.

The charge pump 120-1 performs a charging/discharging operation according to an applied up-signal UP or a down-signal DOWN to control an output voltage thereof. The charge pump 120-1 creates a charging loop including an output terminal to increase the output voltage if the up-signal UP has a first logic level (e.g., a logic level of '1' or '0', depending on application), or creates a discharging loop including the output terminal to decrease the output voltage if the down-signal DOWN has the first logic level.\

The loop filter 120-2 filters a specific frequency band from the output signal of the charge pump 120-1 to provide a filtered output signal. For example, the loop filter 120-2 may be a low pass filter or a high pass filter. The output signal of the loop filter 120-2 may correspond to the first control signal, where the first control signal may be applied to the post-processor 120-3A.

The post-processor 120-3A may be used to generate the first control voltage Vbp and the second control voltage Vbn in response to the first control signal provided from the loop filter 120-2.

In one embodiment, the post-processor 120-3A may generate the second control voltage Vbn which is proportional to a voltage level of the first control signal and the first control voltage Vbp which is inversely proportional to a voltage level of the first control signal.

In another embodiment, the post-processor 120-3A may sequentially generate the second control voltage Vbn which is proportional to a voltage level of the first control signal and the first control voltage Vbp which is inversely proportional to a voltage level of the first control signal. That is, the first control voltage Vbp may be generated after the second control voltage Vbn is generated.

In still another embodiment, the post-processor 120-3A may generate the first and second control voltages Vbp and Vbn based on any one of the coarse control signal for roughly tuning a delay time of the delay circuit 130 and the fine control signal for accurately tuning a delay time of the delay circuit 130 after the coarse control signal and the fine control signal are generated by the post-processor 120-3A. The post-processor 120-3A may generate the second control voltage Vbn which is proportional to a voltage level of the coarse control signal or the fine control signal and the first control voltage Vbp which is inversely proportional to a voltage level of the coarse control signal or the fine control signal.

In yet another embodiment, the post-processor 120-3A may be designed to generate the third and fourth control voltages Vc1 and Vc2 (corresponding to optional control voltages) based on any one of the coarse control signal and the fine control signal. For example, the post-processor 120-3A may generate the fourth control voltage Vc2 which is proportional to a voltage level of the coarse control signal or the fine control signal and the third control voltage Vc1 which is inversely proportional to a voltage level of the coarse control signal or the fine control signal.

Figure 16:
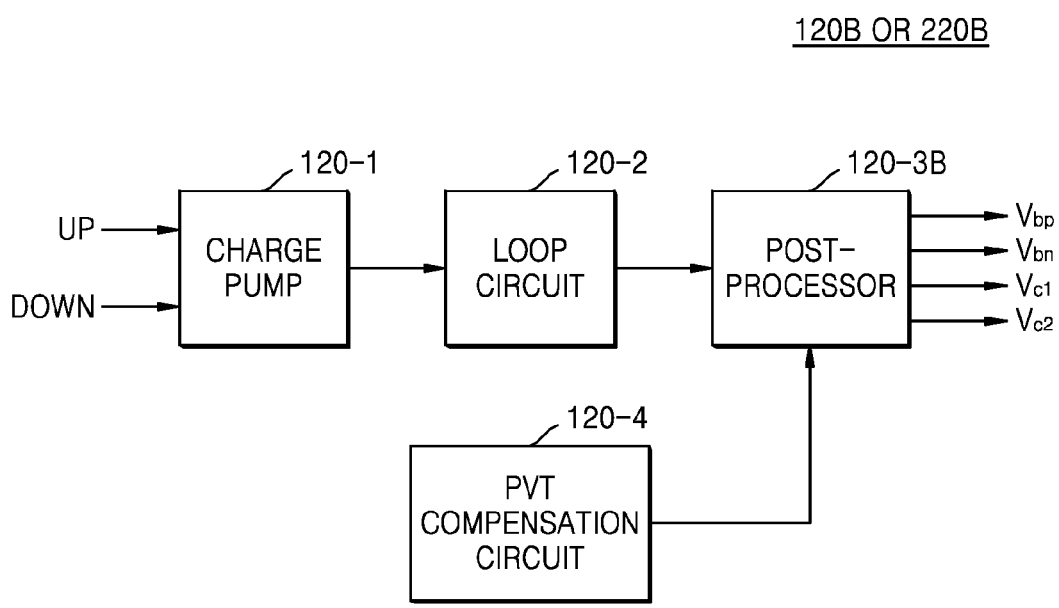

FIG. 16 is a block diagram illustrating a control circuit 120B as another example of the control circuits 120 illustrated in FIGS. 10 and 11 or a control circuit 220B as another example of the control circuit 220 illustrated in FIG. 13.

Referring to FIG. 16, the control circuit 120B/220B again includes the charge pump 120-1, loop filter 120-2, and post-processor 120-3B as well as a process/voltage/temperature (PVT) compensation circuit 120-4. The charge pump 120-1 and loop filter 120-2 may have the same configurations as described with reference to FIG. 15.

The PVT compensation circuit 120-4 detects a process variation, voltage variation, and/or temperature variation and may be used to generate the second control signal based on the detected process/voltage/temperature (PVT) variation to compensate for a delay time due to the PVT variation.

The post-processor 120-3B may generate various control voltages for controlling a delay time of the delay cells included in the delay circuit 130 or the voltage-controlled oscillator 230 in response to the first control signal provided from the loop filter 120-2 and the second control signal provided from the PVT compensation circuit 120-4.

In one embodiment, the post-processor 120-3B may generate the first and second control voltages Vbp and Vbn based on the first control signal provided from the loop filter 120-2 and may generate the fourth control voltage Vc2 based on the second control signal provided from the PVT compensation circuit 120-4. In addition, the post-processor 120-3B may generate the third and fourth control voltages Vc1 and Vc2 based on the second control signal. Specifically, the post-processor 120-3B may generate the second control voltage Vbn which is proportional to a voltage level of the first control signal and the first control voltage Vbp which is inversely proportional to a voltage level of the first control signal. Moreover, the post-processor 120-3B may generate the fourth control voltage Vc2 which is proportional to a voltage level of the second control signal. Furthermore, the post-processor 120-3B may generate the fourth control voltage Vc2 which is proportional to a voltage level of the second control signal and the third control voltage Vc1 which is inversely proportional to a voltage level of the second control signal.

In another embodiment, the post-processor 120-3B may generate the first and second control voltages Vbp and Vbn based on the second control signal and may generate the fourth control voltage Vc2 based on the first control signal. In addition, the post-processor 120-3B may generate the third and fourth control voltages Vc1 and Vc2 based on the first control signal.

The post-processor 120-3B may generate various control voltages based on the coarse control signal or the fine control signal, like the post-processor 120-3A described with reference to FIG. 15.

Figure 17:
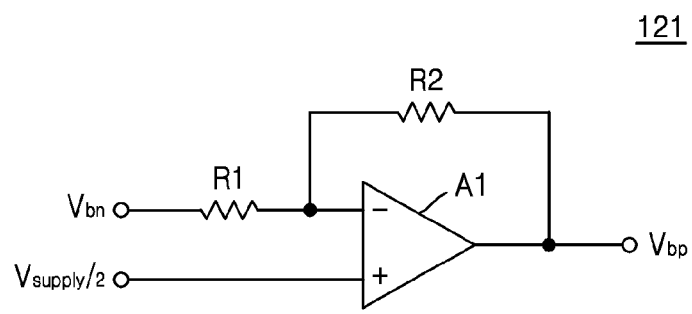
FIG. 17 is a circuit diagram illustrating an output circuit that may be included in the control circuits of FIGS. 15 and 16.

FIG. 17 is a circuit diagram illustrating an output circuit 121 that may be used to generate the first control voltage Vbp from the second control voltage Vbn. The output circuit 121 may be employed in the control circuit 120 illustrated in FIG. 10 or 11 or may be employed in the post-processor 120-3A or 120-3B shown in FIG. 15 or 16.

Referring to FIG. 17, the output circuit 121 may include an operational amplifier (OPAMP) A1 and a plurality of resistors, for example, first and second resistors R1 and R2.

The first resistor R1 may be coupled between a negative input terminal of the OPAMP A1 and a terminal to which the second control voltage Vbn is applied, and the second resistor R2 may be coupled between the negative input terminal and an output terminal of the OPAMP A1. A constant voltage, which is initially set, may be applied to a positive input terminal of the OPAMP A1. For example, a voltage corresponding to half of the power supply voltage $V_{SUPPLY}$ may be applied to the positive input terminal of the OPAMP A1.

Accordingly, the first control voltage Vbp induced at the output terminal of the OPAMP A1 may be expressed by the equation: Vbp=−(R2/R1) (Vbn−VSUPPLY/2)+VSUPPLY/2. As may be seen from this equation, the second control voltage Vbn decreases if the first control voltage Vbp increases, and the second control voltage Vbn increases if the first control voltage Vbp decreases. As a result, the first control voltage Vbp provided from the OPAMP A1 may be inversely proportional to the second control voltage Vbn.

Figure 18:
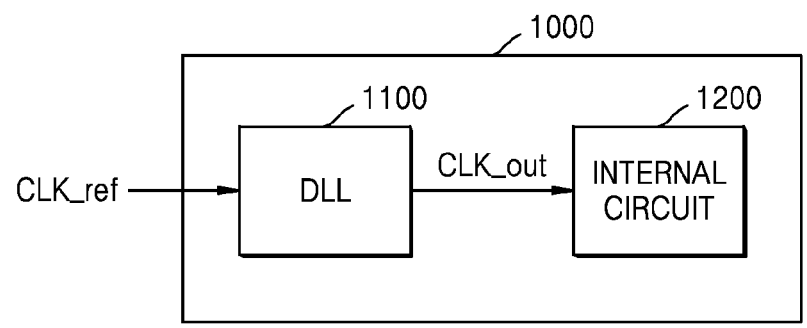
FIGS. 18 and 19 are respective block diagrams illustrating different electronic devices including either a delay locked loop circuit or a phase locked loop circuit according to various embodiments of the inventive concept.

FIG. 18 is a block diagram illustrating an electronic device 1000 including a DLL circuit 1100 according to various embodiments of the inventive concept and an internal circuit 1200.

The DLL circuit 1100 may correspond to the DLL circuit 100A of FIG. 10 or the DLL circuit 100B of FIG. 11.

The internal circuit 1200 may execute a signal processing operation in response to the output clock signal CLK_out provided from the DLL circuit 1100. For example, the internal circuit 1200 may include a semiconductor memory circuit, a memory card circuit, a mobile phone circuit, a camera circuit, a computer circuit, a communication circuit, or the like.

Figure 19:
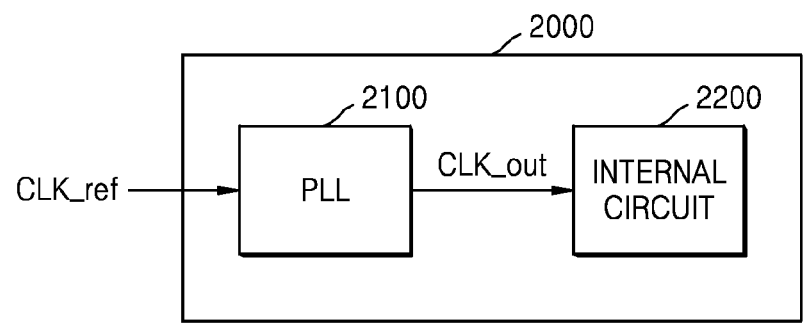

FIG. 19 is a block diagram illustrating an electronic device 2000 including a PLL circuit 2100 according to various embodiments of the inventive concept and an internal circuit 2200.

The PLL circuit 2100 may correspond to the PLL circuit 200 of FIG. 13.

The internal circuit 2200 may execute a signal processing operation in response to the output clock signal CLK_out provided from the PLL circuit 2100. For example, the internal circuit 2200 may include a semiconductor memory circuit, a memory card circuit, a mobile phone circuit, a camera circuit, a computer circuit, a communication circuit, or the like.

While the inventive concept has been particularly shown and described with reference to exemplary embodiments thereof, it will be understood that various changes in form and details may be made therein without departing from the scope of the following claims.

What is claimed is:

1. A delay cell comprising:
a first transistor having a first terminal connected to a power supply voltage terminal, a second terminal connected to an output terminal, and a gate terminal connected to an input terminal; and
a second transistor having a first terminal connected to a ground terminal, a second terminal connected to the output terminal, and a gate terminal connected to the input terminal,
wherein each of the first and second transistors has a fully depleted silicon-on-insulator (FD-SOI) structure, and at least one of a first control voltage and a second control voltage is applied to at least one of bodies of the first transistor and the second transistors to adjust a delay time of the delay cell.

2. The delay cell of claim 1, wherein the first transistor is a P-type Metal Oxide Semiconductor (PMOS) transistor and the second transistor is an N-type MOS (NMOS) transistor.

3. The delay cell of claim 1, wherein each of the first transistor and second transistor comprises:
a body layer;
a buried insulation layer on the body layer;
a pair of impurity regions disposed on the buried insulation layer to function as source/drain regions;
a semiconductor layer disposed between the pair of impurity regions in contact with the buried insulation layer;
a gate insulation layer on a top surface of the semiconductor layer opposite to the buried insulation layer; and
a gate electrode on the gate insulation layer.

4. The delay cell of claim 3, wherein the body layer of the first transistor is N-type and the pair of impurity regions of the first transistor are P-type, and
the body layer of the second transistor is P-type and the pair of impurity regions of the second transistor are N-type.

5. The delay cell of claim 1, wherein the first terminals of the first and second transistors are source terminals and the second terminals of the first and second transistors are drain terminals.

6. The delay cell of claim 1, wherein each of the first and second transistors has an ultra-thin body and buried oxide (UTBB) FD-SOI structure.

7. The delay cell of claim 1, further comprising:
a third transistor coupled between the power supply voltage terminal and the first terminal of the first transistor; and
a fourth transistor coupled between the ground terminal and the first terminal of the second transistor,
wherein the third transistor has a first terminal connected to the power supply voltage terminal, a second terminal connected to the first terminal of the first transistor, and a gate terminal to which a third control voltage is applied, and
the fourth transistor has a first terminal connected to the ground terminal, a second terminal connected to the first terminal of the second transistor, and a gate terminal to which a fourth control voltage is applied.

8. The delay cell of claim 7, further comprising a fifth transistor and a sixth transistor,
wherein the fifth transistor has a first terminal connected to the power supply voltage terminal, a second terminal connected to a node, and a gate terminal connected to the node and the gate terminal of the third transistor, and
the sixth transistor has a first terminal connected to the ground terminal, a second terminal connected to the node, and a gate terminal to which the fourth control voltage is applied.

9. A delay locked loop (DLL) circuit comprising:
a delay circuit that receives a reference clock signal and includes series connected delay cells that applies a delay to the reference clock signal to generated a delayed buffered version of the reference clock signal;
a phase detector that receive the reference clock signal and a feed-back clock signal and generates a first signal corresponding to a phase difference between the feed-back clock signal and the reference clock signal; and
a control circuit that generates a first control signal that defines the delay applied to the reference clock signal in response to the first signal,
wherein the first control signal is applied to a body of at least one of the transistors constituting at least one of the delay cells, the at least one of the transistors having a fully depleted silicon-on-insulator (FD-SOI) structure.

10. The DLL circuit of claim 9, wherein each of the series-connected delay cells has a single ended configuration including an inverter or a differential delay circuit.

11. The DLL circuit of claim 9, wherein the control circuit additionally generates a second control signal that compensates for variation of at least one of a process, voltage, and temperature, and
the second control signal is applied to a gate terminal of a transistor controlling current flowing through the series-connected delay cells.

12. The DLL circuit of claim 9, wherein the control circuit additionally generates a second control signal that compensates for variation of at least one of a process, voltage, and a temperature, and
the second control signal is applied to a body of at least another one of the transistors constituting the at least one of the delay cells, and the first control signal is applied to a gate terminal of a transistor controlling current flowing through the series-connected delay cells.

13. The DLL circuit of claim 9, wherein each of the series-connected delay cells comprises:
a first transistor having a first terminal connected to a power supply voltage terminal, a second terminal connected to an output terminal, and a gate terminal connected to an input terminal; and a second transistor having a first terminal connected to a ground terminal, a second terminal connected to the output terminal, and a gate terminal connected to the input terminal, wherein each of the first and second transistors has a fully depleted silicon-on-insulator (FD-SOI) structure, and the first control signal is applied to the body of the first transistor.

14. The DLL circuit of claim 9, further comprising:

a replica delay circuit that receives the delayed buffered version of the reference clock signal as the feed-back signal from the delay circuit and compensates for an essential delay time of a system incorporating the DLL circuit.

15. The DLL circuit of claim 14, wherein the replica delay circuit is a delay model circuit associated with the essential delay time.

16. A phase locked loop (PLL) circuit comprising:

a phase detector that receives a reference clock signal and a divided feed-back clock signal and generates a first signal corresponding to a phase difference between the divided feed-back clock signal and the reference clock signal;

a control circuit that generates a first control signal that defines a delay applied to the reference clock signal in response to the first signal;

a voltage controlled oscillator including delays cells and applying the delay to the reference clock signal to generate the feed-back clock signal; and a divider that receives the feed-back clock signal to generate the divided feed-back clock signal, wherein the first control signal is applied to a body of at least one of the transistors constituting at least one of the delay cells, the at least one of the transistors having a fully depleted silicon-on-insulator (FD-SOI) structure.

17. The PLL of claim 16, wherein the first signal is a phase control signal including an up-signal or a down-signal.

18. The PLL of claim 17, wherein the control circuit increases a voltage level of the first control signal in response to the up-signal, or decreases a voltage level of the first control signal in response to the down-signal.

19. The PLL of claim 17, wherein the control circuit generates a coarse control signal that roughly tunes the delay applied by the voltage-controlled oscillator, and a fine control signal that accurately tunes the delay applied by the voltage-controlled oscillator.

20. The PLL of claim 17, wherein the control circuit generates a second control signal that compensates for variation of at least one of a process, voltage, and temperature.

* * * * *